US008175462B2

(12) United States Patent
Wong et al.

(10) Patent No.: US 8,175,462 B2
(45) Date of Patent: May 8, 2012

(54) FIBER OPTIC TRANSCEIVER (FOT) MODULE AND METHOD FOR MANUFACTURING AN FOT MODULE

(75) Inventors: Tom Sheau Tong Wong, Singapore (SG); Tze Wei Lim, Singapore (SG); Adrianus Van Haasteren, Singapore (SG)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 684 days.

(21) Appl. No.: 12/349,910

(22) Filed: Jan. 7, 2009

(65) Prior Publication Data

US 2010/0172652 A1     Jul. 8, 2010

(51) Int. Cl.
*H04B 10/00* (2006.01)
(52) U.S. Cl. ........... 398/140; 398/25; 398/135; 398/139

(58) Field of Classification Search .................... 398/22, 398/135, 140
See application file for complete search history.

(56) References Cited

U.S. PATENT DOCUMENTS

2010/0080567 A1* 4/2010 McColloch et al. .......... 398/135
* cited by examiner

*Primary Examiner* — Dung Nguyen

(57) ABSTRACT

A fiber optic transceiver (FOT) module is provided that has a circuit board attached to the FOT leadframe. The circuit board, which is typically a printed circuit board (PCB), provides several advantages over typical FOT module designs in that it provides additional surface area for mounting additional components, enables components to be moved from the motherboard into the module, allows the I/O pin count of the FOT module to be increased without increasing the width or footprint associated with the module, allows bond wires to be shortened, provides improved performance over changes in temperature, allows manufacturing yield to be improved, and enables improvements in signal integrity to be realized.

23 Claims, 7 Drawing Sheets

FIBER OPTIC TRANSCEIVER (FOT) MODULE AND METHOD FOR MANUFACTURING AN FOT MODULE

TECHNICAL FIELD OF THE INVENTION

The invention relates to fiber optic transceiver (FOT) modules and methods for manufacturing FOT modules.

BACKGROUND OF THE INVENTION

In optical communications applications, optical transmitter modules are used to generate optical data signals, which are then transmitted over an optical waveguide, which is typically an optical fiber. An optical transmitter module includes a driver integrated circuit (IC) that receives an electrical data signal containing bits of data at its input, and produces, at its output, an electrical drive current signal. The electrical drive current signal is applied to a light source, such as, for example, a light emitting diode (LED), which causes it to emit an optical data signal. An optics system (e.g., a lens) receives the optical data signal and couples the optical data signal to the optical fiber, which then transmits the optical data signal over a network to some destination.

An optical receiver modules includes a photo detector such as, for example, a photodiode, which receives an optical data signal transmitted over an optical fiber. An optics system (e.g., a lens) of the receiver module couples the optical data signal from the optical fiber end onto the photodiode. The photodiode converts the optical data signal into an electrical data signal. Electrical circuitry (e.g., amplifiers, filters, clock and data recovery circuitry) of the receiver module conditions the electrical data signal and recovers the data bits.

Optical transmitter and optical receiver modules may be packaged separately, but are often packaged together in an optical transceiver module to provide a single package that has both transmit and receive functionality. A variety of optical transceiver modules are in use today. An optical transceiver module may have multiple transmit channels and multiple receive channels or a single transmit channel and a single receive channel. One common optical transceiver module design of the latter type is commonly referred to as a Fiber Optic Transceiver (FOT) module design.

FIG. 1 illustrates a side perspective view of a typical known FOT module. The module 2 includes a standard four-pin metal lead frame 3, an optical active device 4, an optics system 5, an IC 6, and an encapsulation device 7. The leadframe 3 includes four input/output (I/O) pins 11 that are configured to be electrically connected on their distal ends 11a to electrical contacts (not shown) on a printed circuit board (PCB) (not shown). The proximal ends 11b of the pins 11 are configured to function as surface areas on the leadframe 3 to which electrical devices and/or electro-optical devices can be attached and wire bonded. The leadframe 3 and the devices 4 and 6 attached thereto are encapsulated inside of the encapsulation device 7. The encapsulation device 7 is typically a structure made of a clear polymer material, which secures the leadframe 3 in place. Prior to this molding process being performed, the active device 4 (e.g., an LED) and the IC 6 (e.g., a driver IC) are attached to the leadframe 3 and electrical contacts on the IC 6 are wire bonded to the leadframe 3 by bond wires 12. Electrical contacts on the active device 4 and on the IC 6 are also connected to each other via one or more bond wires 13. During the molding process, the optics system 5, which is typically a spherical lens, is formed in the encapsulation device 7 and is aligned with the active device 4.

The FOT module 2 may be a transmitter module, a receiver module or a transceiver module. In the case in which the FOT module 2 is an optical transceiver module (i.e., has both transmit and receive functionality), a second active device (not shown) may be attached to the leadframe 3 at location 16. If the active device 4 is a laser diode or light emitting diode (LED), for example, the second active device that attaches at location 16 will typically be an optical-to-electrical conversion device, such as a photodiode, for example. In the case in which the FOT module 2 is a transmitter module only, the active device 4 is a laser diode or LED and the IC 6 is a driver IC for driving the laser diode or the LED. In the case in which the FOT module 2 is a receiver module only, the active device 4 is a photodiode and the IC 6 is a receiver IC for processing electrical signals produced by the photodiode.

The design of the FOT module 2 shown in FIG. 1 has certain disadvantages. For example, it can be seen from FIG. 1 that there is very little surface area on the proximal ends 11b of the leadframe 3 to which additional components may be attached. For this reason, any other ICs (e.g., a transceiver micro controller IC) and any passive components (e.g., resistors, capacitors, inductors, etc.) are typically mounted on a motherboard (not shown) that is external to the FOT module 2. As a result, signal quality is often degraded. In addition, the ability to provide additional features and functionality inside of the FOT module 2 is limited.

Another disadvantage of the design of the FOT module 2 shown in FIG. 1 is that the bond wires 12 and 13 are relatively long in length. Creating these long bond wires 12 and 13 during manufacturing can be difficult and can result in the bond wires 12 and 13 having breaks or collapsing. Consequently, manufacturing yield is reduced. In addition, long bond wires can result in other problems, including, for example, performance degradation caused by cross talk between adjacent bond wires, increased inductance, and increased power consumption due to resistive loss.

SUMMARY OF THE INVENTION

The invention is directed to an FOT module and a method for making the FOT module. The FOT module includes a leadframe comprising at least a plurality of I/O pins and a printed circuit board (PCB) attachment area, a plurality of electrically conductive attachment devices disposed on distal ends of at least some of the I/O pins of the leadframe and on the circuit board attachment area of the leadframe, a PCB having at least an upper surface and a lower surface, a plurality of electrically conductive attachment pads on the lower surface of the PCB, a plurality of electrically conductive bond pads on one or both of the upper and lower surfaces of the PCB, at least one IC, at least one optical active device, and at least one passive device mounted on one or both of the upper and lower surfaces of the PCB, and a plurality of bond wires. The electrically conductive attachment pads on the lower surface of the PCB are in contact with respective ones of the electrically conductive attachment devices disposed on the leadframe. The contact between the electrically conductive attachment pads and the respective electrically conductive attachment devices on the PCB operates to secure the PCB to the leadframe and to provide electrical connections between the leadframe and the PCB. Each bond wire has a first end and a second end. The first ends of at least some of the bond wires are attached to electrical contact pads on the IC and the second ends of at least some of the bond wires are attached to at least some of the electrically conductive bond pads on the PCB.

The method includes providing a PCB having electrically conductive bonds pads on at least one surface thereof, placing an electrically conductive adhesive material on an FOT leadframe at particular locations on the leadframe, placing the PCB in contact with the leadframe such that one or more of the electrically conductive bond pads of the PCB comes into contact with the electrically conductive adhesive material on the leadframe, attaching at least a first IC, at least a first optical active device, and at least a first passive device to at least one surface of the PCB, electrically interconnecting one or more electrically conductive contact pads of the first IC with one or more of the electrically conductive bond pads of the PCB, and encapsulating at least a portion of the leadframe to which the PCB is attached within an encapsulation such that the encapsulation encapsulates at least the PCB, the first IC, the first optical active device, and the first passive device. The encapsulation has at least a first optical element formed therein at a location on the encapsulation for coupling light between the first optical active device and a first end of an optical fiber.

These and other features and advantages of the invention will become apparent from the following description, drawings and claims.

DETAILED DESCRIPTION OF AN ILLUSTRATIVE EMBODIMENT

In accordance with an embodiment of the invention, an FOT module is provided that includes a PCB attached to an FOT leadframe. Including the PCB in the FOT module provides several advantages over typical FOT module designs in that it provides additional surface area for mounting additional components, thus enabling components to be moved from the motherboard into the module, allows the I/O pin count of the FOT module to be increased without increasing the width or footprint associated with the module, allows bond wires to be shortened, provides improved performance over changes in temperature, allows manufacturing yield to be improved, and enables improvements in signal integrity to be realized.

Figure 1:
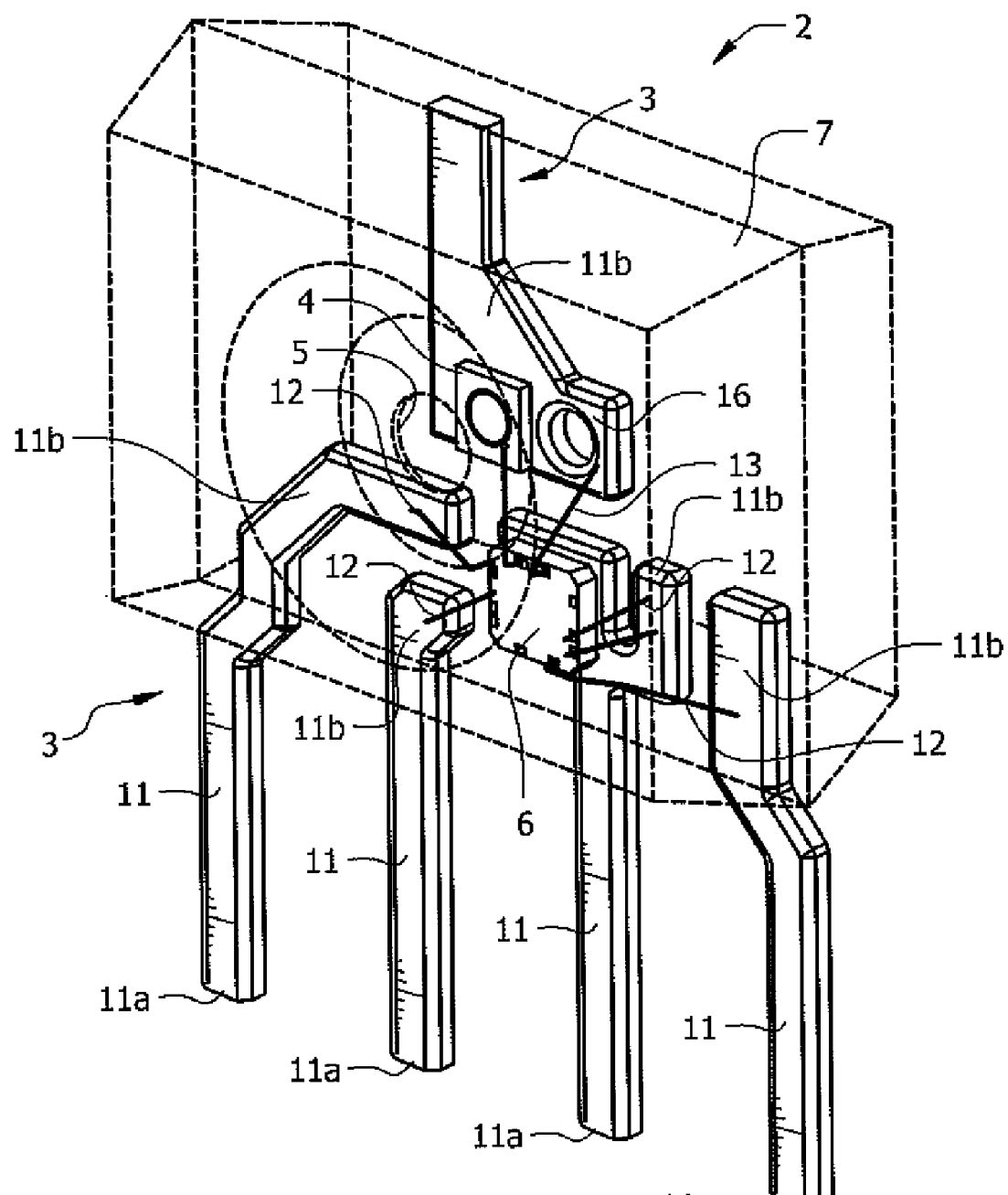
FIG. 1 illustrates a side perspective view of a typical known FOT module.
Figure 2:
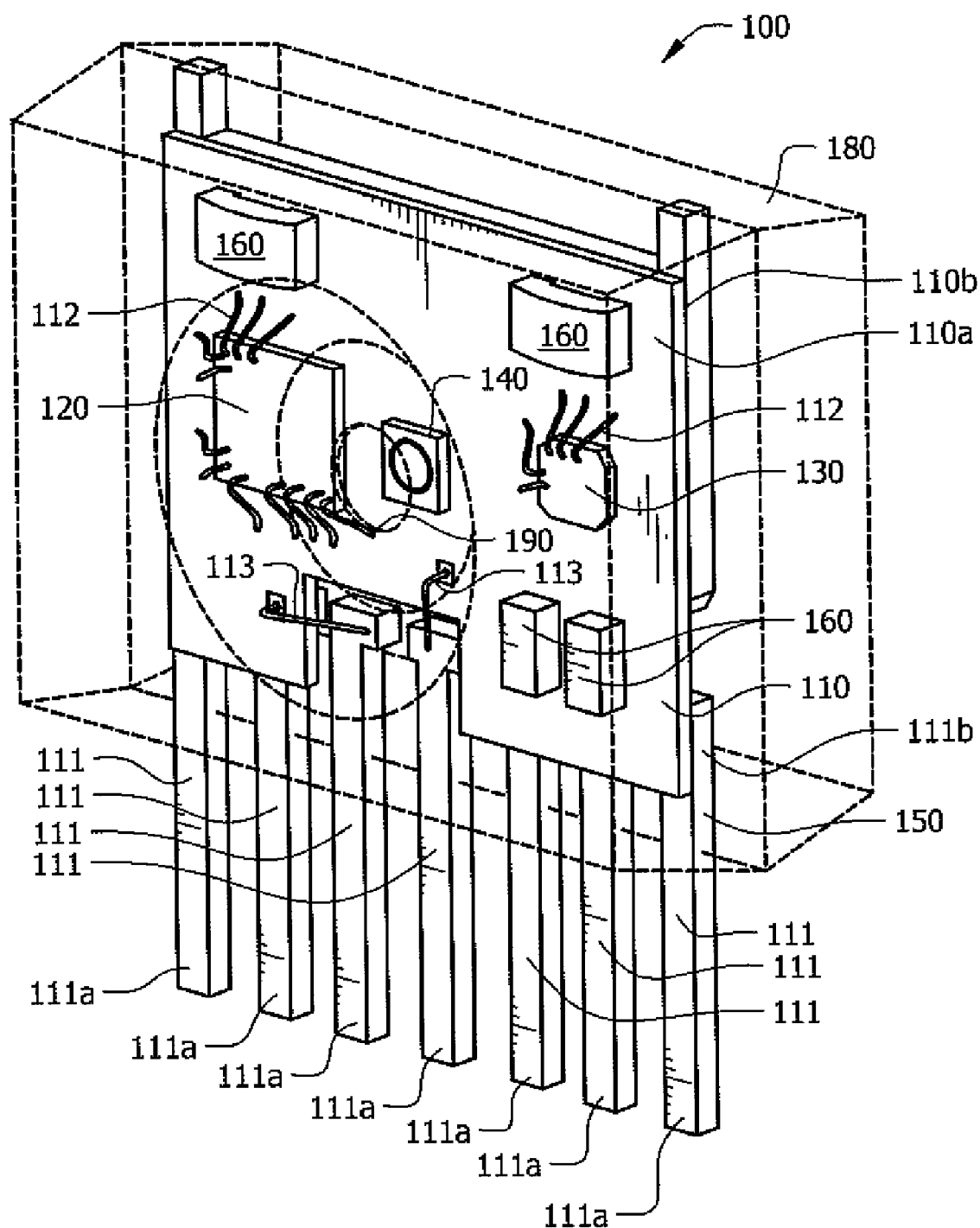
FIG. 2 illustrates an FOT module in accordance with an illustrative embodiment of the invention.

FIG. 2 illustrates an FOT module 100 in accordance with an illustrative embodiment of the invention. The FOT module 100 includes a PCB 110 that is attached to an FOT leadframe 150, which is similar or identical to the standard FOT leadframe 3 shown in FIG. 1. One or more ICs 120 and 130, one or more optical active devices 140, and one or more passive devices 160 are mounted on an upper surface 110a of the PCB 110. The ICs 120 and 130 have I/O pads (not shown) that are wire bonded via bond wires 112 to electrical conductors (not shown) of the PCB 110. The leadframe 150 includes multiple I/O pins 111 for electrically interconnecting the PCB 110 to a motherboard (not shown) via the distal ends 111a of the I/O pins 111. One or more electrical conductors of the PCB 110 are wire bonded via bond wires 113 to proximal ends 111b of the I/O pins 111. As will be described below with reference to FIGS. 3 and 4, the lower surface 110b of the PCB 110 has electrically conductive pads (e.g., solder pads) on it that come into contact with respective ones of the proximal ends 111b of the I/O pins 111 when the PCB 110 is attached to the leadframe 150.

A clear polymer encapsulation 180 encapsulates the PCB 110, the portion of the leadframe 150 on which the PCB 110 is mounted, and the components 120-160. The distal ends 111a of the I/O pins 111 are external to the encapsulation 180. The encapsulation 180 has one or more optical elements 190 formed therein for either directing light from an end of an optical waveguide (not shown) onto a respective optical active device 140 or for directing light generated by a respective optical active device 140 onto an end of an optical waveguide (not shown). Although only one optical active device 140 is shown in FIG. 2, the FOT module 100 may include multiple optical active devices, as will be described below with reference to FIG. 8. The term "optical active device", as that term is used herein, is intended to denote either an electrical-to-optical conversion device, such as, for example, a laser diode or light emitting diode (LED) or an optical-to-electrical conversion device, such as, for example, a photodiode. In the case of a laser diode or LED, the optical element 190 directs light output by the laser diode or LED onto the end of an optical waveguide, such as an optical fiber, for example, for transmission over a network. In the case of a photodiode, the optical element 190 directs light received from an optical waveguide, such as, for example, an optical fiber, onto the photodiode. For illustrative or exemplary purposes, it will be assumed that the active device 140 shown in FIG. 2 is a photodiode and that the optical element 190 is a refractive lens that couples light from an end of an optical fiber onto the photodiode 140.

It can be seen by comparing FIGS. 1 and 2 that the PCB 110 shown in FIG. 2 provides significantly more surface area on which additional components may be mounted than that which is provided on the proximal ends 11b of the I/O pins 11 of the leadframe 3 shown in FIG. 1. This feature provides several advantages over the standard FOT design shown in FIG. 1, including, for example, additional functionality as compared to the FOT module 2 shown in FIG. 1. Another advantage of the embodiment shown in FIG. 2 is that the number of I/O pins 111 can be increased without increasing the width of the leadframe 150 because the proximal ends 111b of the pins 111 can be made smaller in size.

Yet another advantage of the FOT module 100 shown in FIG. 2 over the FOT module 2 shown in FIG. 1 is that the module 100 has improved performance and reliability over changes in temperature due to the fact that the coefficient of thermal expansion (CTE) of the encapsulation 180 is closer to that of the material of which the PCB 110 is made. PCBs typically have a substrate that is made of a polymer material. Because encapsulation 180 is also made of a polymer material, when changes in temperature cause the polymer encapsulation 180 to expand or contract, the PCB 110 will expand or contract by a substantially equal amount due to the CTE of the PCB 110 being substantially the same, or very close to, the CTE of the encapsulation 180. This ensures that the optical element 190 will remain aligned with the optical active device 140 even as the module 100 undergoes changes in temperature. Yet another advantage of the FOT module 100 shown in FIG. 2 over the FOT module 2 shown in FIG. 1 is that the bond wires 112 and 113 shown in FIG. 2 can be made to have shorter lengths than the bond wires 12 and 13 shown in FIG. 1, due to the fact that electrical bond pads of the PCB 110 can be located very close to the corresponding I/O pads on the ICs 120 and 130. This reduces wire bond lengths, thereby allowing manufacturing yield to be increased. In addition, shorter bond wires reduce the potential for cross talk between adjacent bond wires.

Figure 3:
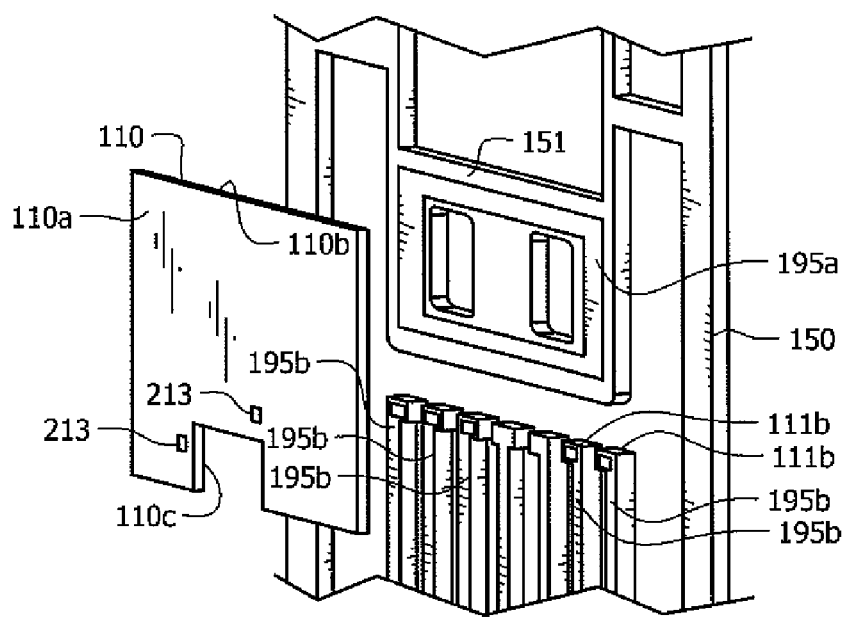
FIGS. 3 and 4 illustrative front and back perspective views, respectively, of the leadframe and PCB shown in FIG. 2.
Figure 4:
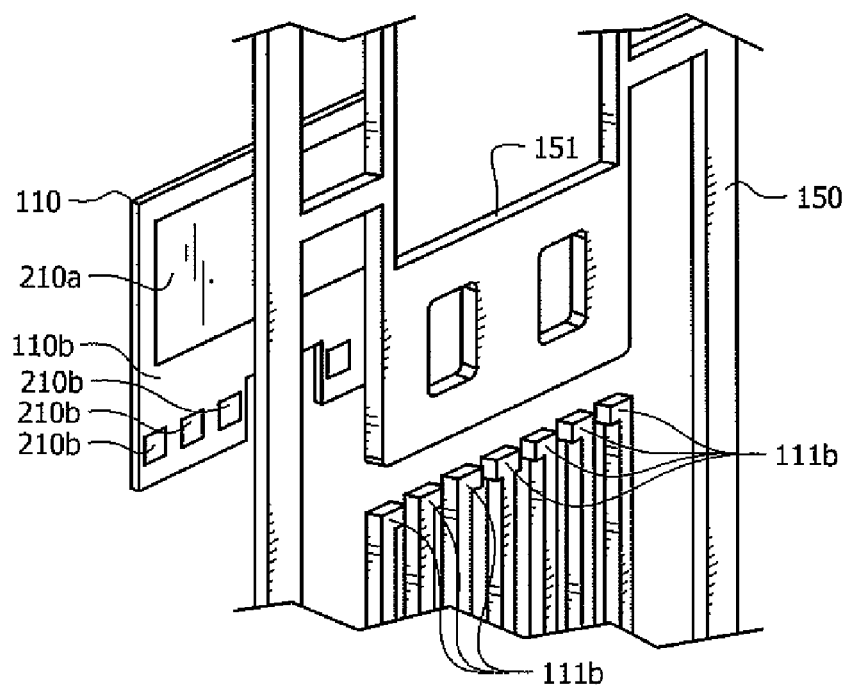

FIGS. 3 and 4 illustrative front and back perspective views, respectively, of the leadframe 150 and PCB 110 shown in FIG. 2. As shown in FIG. 3, the leadframe 150 has an attachment device 195a disposed on the attachment area 151 of the leadframe 150. In accordance with this embodiment, the attachment device 195a is an epoxy ring. Five of the seven I/O pins 111 have electrically conductive attachment devices 195b disposed on their proximal ends 111b. In accordance with this embodiment, the electrically conductive attachment devices 195b are small amounts of electrically conductive epoxy that are deposited on the proximal ends 111b of at least some of the I/O pins 111. The PCB 110, in accordance with this embodiment, has a cutaway area 110C formed in it where a portion of the PCB 110 has been removed. With reference to FIG. 4, the lower surface 110b of the PCB 110 has a large electrically conductive attachment pad 210a and several small electrically conductive attachment pads 210b thereon. The pads 210A and 210B comprise an electrically conductive material. When the lower surface 110b of the PCB 110 is aligned and placed on the leadframe 150, the large pad 210a comes into conductive contact with the epoxy ring 195a and the small solder pads 210b come into contact with the conductive epoxy deposits 195b disposed on the respective proximal ends 111b of the respective I/O pins 111. The conductive epoxy deposits 195a and the epoxy ring 195b securely fix the PCB 110 to the leadframe 150 and provide electrical connections between the leadframe 150 and the PCB 110.

After the PCB 110 has been secured to the leadframe 150 in the manner described above with reference to FIGS. 3 and 4, a die attachment process is used to attach the components 120-160 described above with reference to FIG. 2 to the upper surface 110a of the PCB 110. The die attachment process may be a typical die attachment process used to attach ICs to a PCB. After the die attachment process has been performed, a wire bonding process is used to connect the I/O pads of the ICs 120, 130 and the optical active device 140 to the electrical bond pads (not shown) of the PCB 110 via the metal bond wires 112 (FIG. 2). The electrical contact pads of the PCB 110 are electrically connected to the large or small solder pads 210a and 210b on the PCB 110, which, in turn, are electrically connected by conductive epoxy deposits 195b, to the leadframe 150. In accordance with the embodiment illustrated in FIGS. 2-4, the upper surface 110a of the PCB 110 has two electrically conductive (e.g., solder) pads 213 thereon, which are wire bonded via bond wires 113 (FIG. 2) to the proximal ends 111b of the two innermost I/O pins 111 of the leadframe 150.

Figure 5:
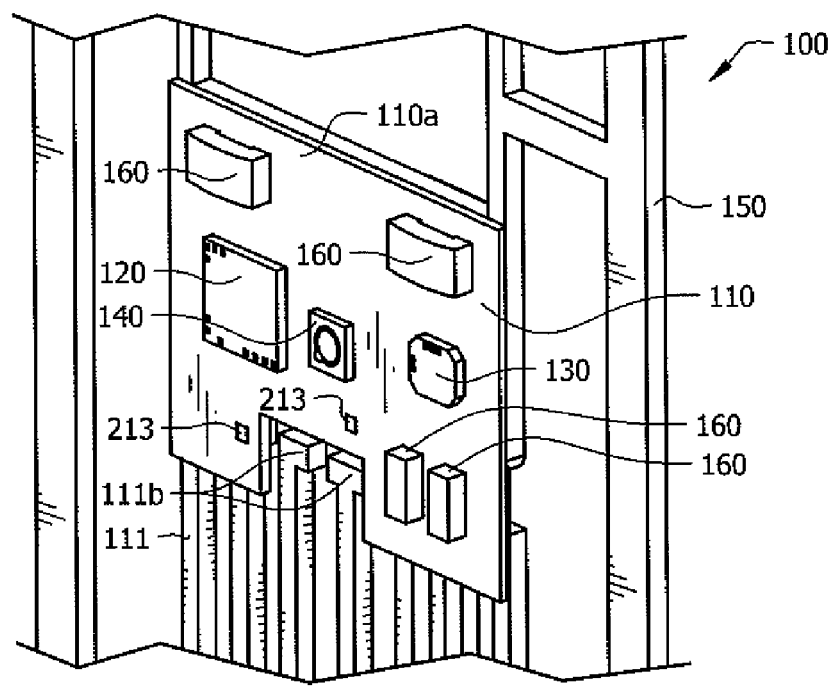
FIG. 5 illustrates a front perspective view of the FOT module shown in FIG. 2 during the manufacturing process, which shows the PCB attached to the leadframe and the components attached to the upper surface of the PCB.
Figure 6:
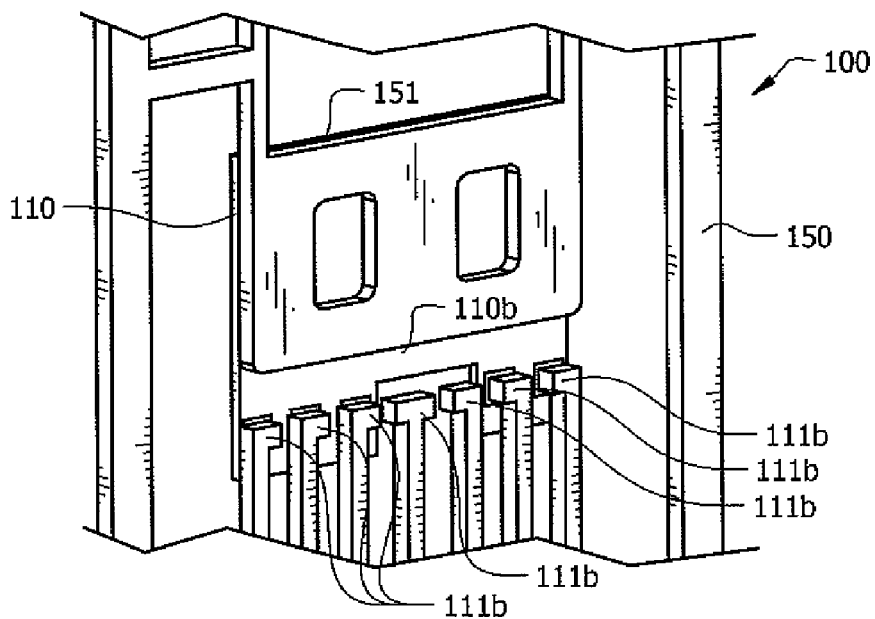
FIG. 6 illustrates a back perspective view of the FOT module shown in FIG. 2 during the manufacturing process, which shows the lower surface of the PCB attached to the leadframe.

FIG. 5 illustrates a front perspective view of the FOT module 100 during the manufacturing process, which shows the PCB 110 attached to the leadframe 150 and the components 120-160 attached to the upper surface 110a of the PPCB 110. FIG. 6 illustrates a back perspective view of the FOT module 100 during the manufacturing process, which shows the lower surface 110b of the PCB 110 attached to the leadframe 150. The two solder pads 213 and the ends 111b of the two innermost I/O pins 111 of the leadframe 150 can be seen in FIG. 5. The ends 111b of the two innermost I/O pins 111 are left uncovered by the PCB 110 due to the cutaway area 110C of the PCB 110. Thus, the cutaway area 110C provides an opening through which the bond wires 113 (FIG. 2) can be bonded to the conductive bond pads 213. At the stage of the manufacturing process represented by FIGS. 5 and 6, the die attach process has been performed, but the wire bonding process has not yet been performed.

Figure 7:
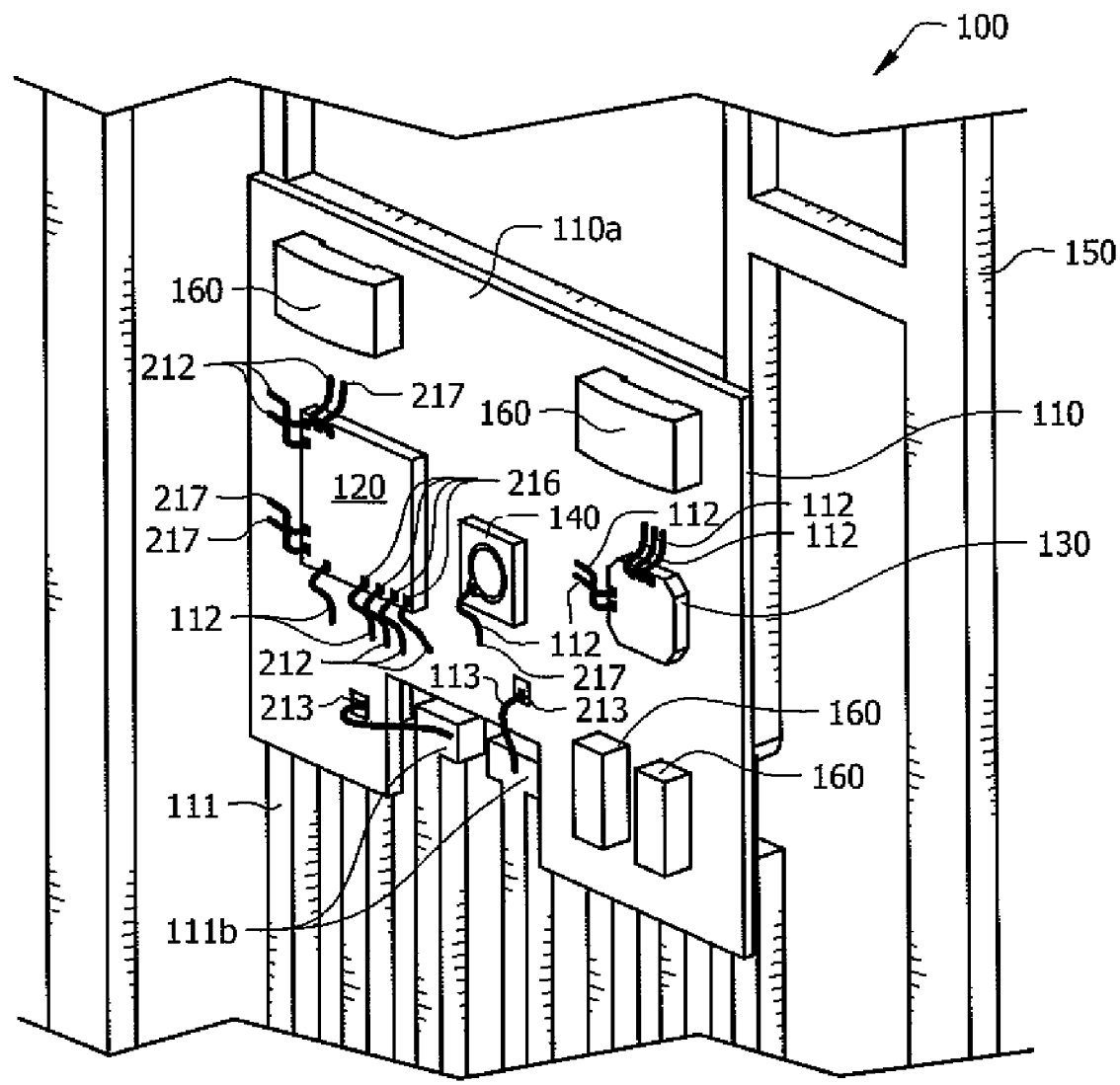
FIG. 7 illustrates a front perspective view of the FOT module shown in FIG. 2 during the manufacturing process, which shows the module after the die attachment and wire bonding processes have been performed.

FIG. 7 illustrates a front perspective view of the FOT module 100 during the manufacturing process, which shows the module 100 after the die attach and wire bonding processes have been performed. As shown in FIG. 7, the bond wires 112 have been bonded to electrically connect the bond pads 216 on the ICs 120, 130 and the optical active device 140 to the bond pads 217 of the PCB 110. Also shown in FIG. 7, the bond wires 113 have been bonded to electrically connect the bond pads 213 of the PCB 110 to proximal ends 111b of the two innermost I/O pins 111 of the leadframe 150.

With reference again to FIG. 2, after the bond wires 112 and 113 have been bonded, a molding process is performed to encapsulate the leadframe 150 in a clear polymer material. The molding process that is used for this purpose may be the same molding process that is used to form the encapsulation 7 of the known FOT module 2 shown in FIG. 1.

The FOT module of the invention may be a receiver module that has only receiver functionality, a transmitter module that has only transmitter functionality, or a transceiver module that has both transmitter and receiver functionality. In FIG. 2, the FOT module 100 has only one optical active device 140, which is an optical-to-electrical converter such as a photodiode, for example. Therefore, the FOT module 100 shown in FIG. 2 has only receiver functionality. The terms "transceiver module" and "FOT module", as those terms are used herein, are intended to denote modules that include only receiver functionality, modules that include only transmitter functionality, and modules that include both transmitter and receiver functionality. In addition, the term "FOT module", as that term is used herein, is intended to be limited to modules that have a leadframe that is encapsulated in an optically clear, or transmissive, material that has an optical element formed therein that is configured to couple light from an optical active device to an optical waveguide, or visa versa.

Figure 8:
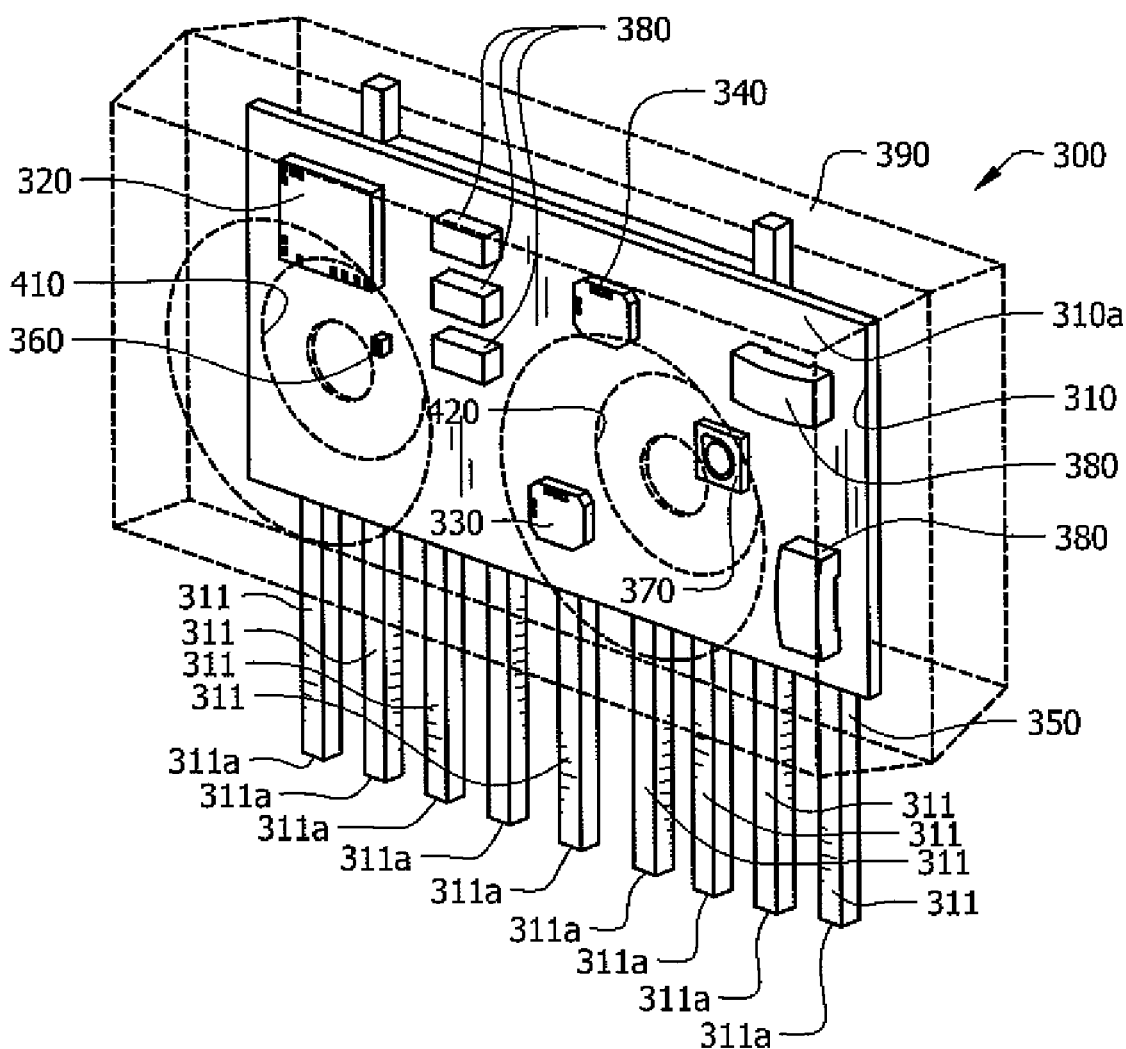
FIG. 8 illustrates a front perspective view of the FOT module in accordance with another embodiment, wherein the module includes a laser diode or LED, a photodiode, ICs, and passive devices, all of which are mounted on a PCB that is encapsulated within an optically transmissive polymer encapsulation.

FIG. 8 illustrates a front perspective view of the FOT module 300 in accordance with another embodiment. In accordance with this embodiment, the FOT module 300 includes both transmitter and receiver functionality. The FOT module 300 includes a PCB 310, ICs 320, 330 and 340, a leadframe 350, a laser diode or LED 360, a photodiode 370, and passive devices 380. The PCB 310 is generally rectangular and does not have a cutaway area formed in it, unlike the PCB 110 shown in FIGS. 2-7 that has the cutaway area 110C. The PCB 310 has an upper surface 310a on which the ICs 320, 330 and 340, the laser diode or LED 360, the photodiode 370, and the passive devices 380 are mounted. A substantially clear, or optically transmissive, polymer encapsulation 390 encapsulates the PCB 310 and the portion of the leadframe 350 to which the PCB 310 is attached. The encapsulation 390 may be made of the same material of which the encapsulation 180 shown in FIG. 2 is made and may be made by the same manufacturing process by which the encapsulation 180 is made.

The upper portion of the leadframe 350, the PCB 310, and all of the components that are mounted on the PCB 310 are encapsulated within the encapsulation 390. The encapsulation 390 has optical elements 410 and 420 formed therein. The optical element 410 receives light generated by the laser diode or LED 360 and couples the light into an end of an optical waveguide (e.g., an optical fiber). The optical element 420 receives light output from an end of an optical waveguide (e.g., an optical fiber) and couples the light onto the photodiode 370. The optical elements 410 and 420 are typically spherical lens surfaces that focus light, but could instead be other types of refractive elements, such as aspherical lenses or Fresnel lenses, or diffractive elements.

The manufacturing process for making the FOT module 300 is essentially identical to that described above with reference to FIGS. 2-7, except that during the die attach and wire bonding processes that are used to make the module 300, the laser diode or LED 360 and the additional components and bond wires (not shown) associated therewith are also attached and wire bonded to the PCB 310. It can be seen that the leadframe 350 has more I/O pins 311 than that possessed by the leadframe 150 shown in FIG. 2. The increased number of I/O pins 311 is due to the addition of the laser diode or LED 360 and the other components that are associated with the laser diode or LED 360. For example, the IC 320 may be a laser diode or LED driver IC associated with the laser diode or LED 360. Some of the passive devices 380 may be associated with the laser diode or LED 360 whereas others of the passive devices 380 may be associated with the photodiode 370. The passive devices 380 typically include one or more resistors, capacitors, and/or inductors. The ICs 330 and 340 may be, for example, a receiver IC and a transceiver controller IC, respectively.

The advantages of the FOT module 300 shown in FIG. 8 over a known FOT module of the type shown in FIG. 1 are generally the same as those described above with reference to FIG. 2, e.g., by incorporating the PCB 310 into the module 300, the module 300 provides additional surface area for mounting additional components, enables components to be moved from the motherboard (not shown) into the module 300, allows the I/O pin count to be increased without increasing the width or footprint associated with the module 300, allows bond wires to be shortened, provides improved performance over changes in temperature, allows manufacturing yield to be improved, and enables improvements in signal integrity to be realized. Another advantage of the FOT module 100 and 300 is that the manufacturing process that is used to make them can be very similar to the manufacturing process that is used to make known FOT modules of the type shown in FIG. 1. The primary change to the manufacturing process are the steps of securing the PCB to the leadframe and attaching and wire bonding the components to the PCB rather than directly to the leadframe. This is a relatively easy change to make to the overall manufacturing process, and, as stated above, because the bond wires can be made shorter, the manufacturing process is simplified and provides an improvement in manufacturing yield.

Figure 9:
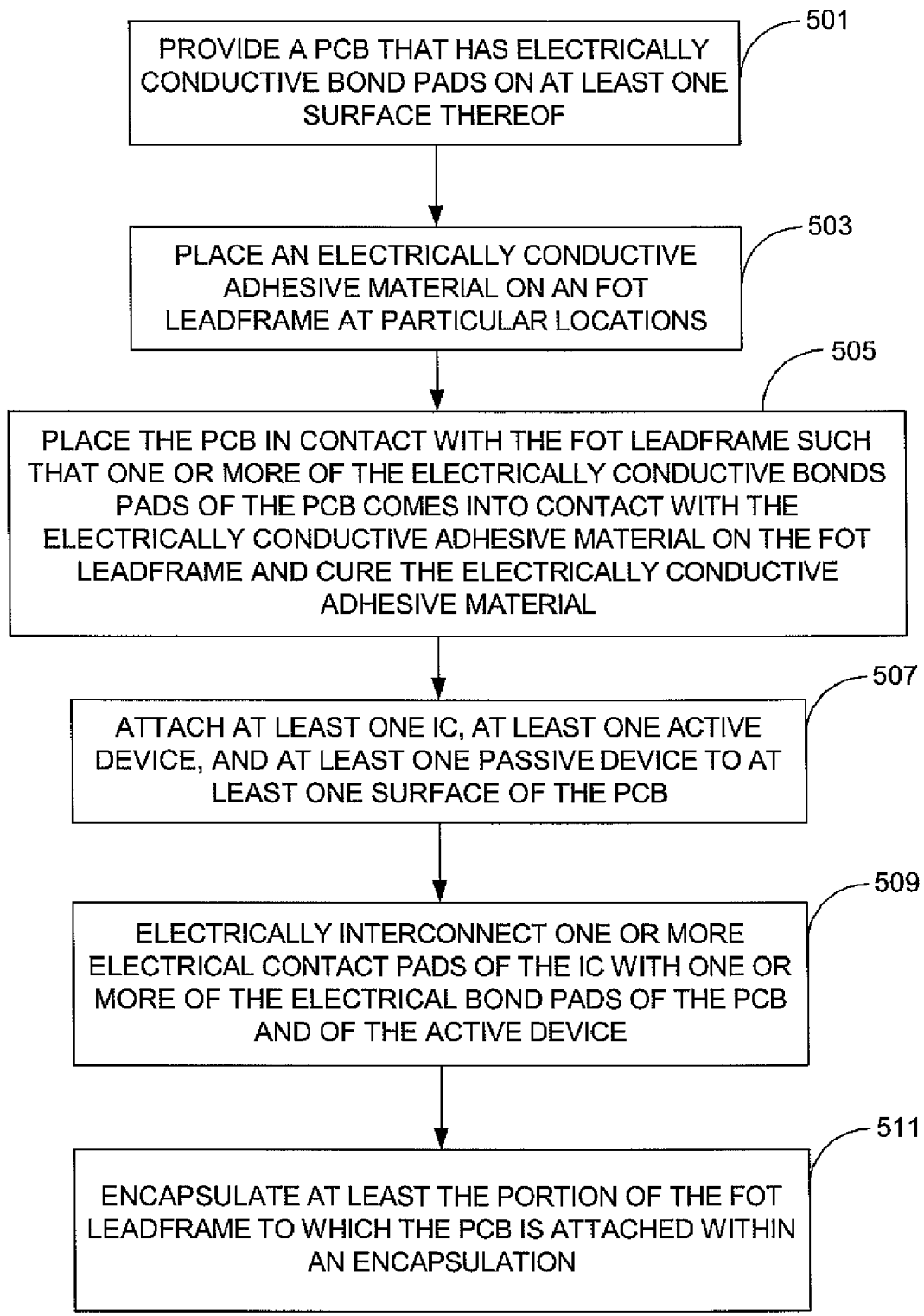
FIG. 9 illustrates a flowchart that represents the method in accordance with an embodiment for making an FOT module that includes a PCB that is attached to the FOT leadframe.

FIG. 9 illustrates a flowchart that represents the method in accordance with an embodiment for making an FOT module that includes a PCB that is attached to the FOT leadframe. Although the blocks of the flowchart representing the steps or processes involved in the method are shown arranged in a particular order, these steps or processes are not limited to being performed in the order depicted in FIG. 9. Persons of ordinary skill in the art will understand, in view of the description being provided herein, the manner in which variations can be made to the order in which these steps or processes are performed. Also, additional steps or processes not depicted in FIG. 9 may be added without deviating from the scope of the invention. Likewise, one or more of the steps or processes shown in FIG. 9 may be eliminated without deviating from the scope of the invention. For example, the steps or processes represented by blocks 501 and 503 may be performed in a reverse order to that shown in FIG. 9.

As indicated by block 501, a PCB is provided that has been configured during a preassembly process to include bond pads (e.g., 210a, 210b, 213, 217 in FIGS. 3, 4 and 7) and other elements that are typically included on PCBs, such as, for example, conductive traces and I/O pads. For ease of illustration, these other elements that are typically included on a PCB, such as conductive traces and I/O pads, are not shown in the figures. An electrically conductive adhesive material such as epoxy (e.g., 195a and 195b in FIG. 3) is placed at particular locations on an FOT leadframe, as indicated by block 503. The lower surface of the PCB is placed in contact with the leadframe such that the conductive adhesive material (195a, 195b) comes into contact with particular ones of the electrically conductive pads (210a and 210b), as indicated by block 505. Curing of the epoxy secures the PCB to the leadframe. At least one IC, one optical active device, and one passive device are attached to at least one (e.g., the upper) surface of the PCB, as indicated by block 507. Electrically conductive contact pads of the IC and of the optical active device are then electrically interconnected to one or more of the bond pads of the PCB, as indicated by block 509. These electrical connections are typically made by performing a wire bonding process during which bond wires are used as interconnects between the pads. The process represented by block 509 may also include electrically connecting one or more electrical contact pads of the PCB directly with proximal ends of one or more I/O pins of the leadframe. At least the portion of the module comprising the leadframe and the PCB attached to the leadframe is encapsulated in an encapsulation, as indicated by block 511. As described above, the encapsulation has at least a first optical element formed therein for coupling light between an end of an optical waveguide (e.g., an optical fiber) and the optical active device.

It should be noted that the invention has been described with reference to a few illustrative embodiments in order to demonstrate the principles and concepts of the invention. The invention, however, is not limited to the embodiments described herein, as will be understood by persons of ordinary skill in the art in view of the description provided herein. For example, although the invention has been described with reference to particular FOT module configurations shown in FIGS. 2-8, the invention is not limited to these particular configurations. Persons of ordinary skill in the art will understand in view of the description provided herein the manner in which these configurations may be modified while still achieving the aforementioned goals and advantages. For example, although FIGS. 2 and 8 only show components that are mounted on the upper surface of the PCB, one or more of these components and/or additional components may be mounted on the lower surface of the PCB. Also, the invention is not limited with respect to the types or number of components that are mounted on the PCB. These and other modifications are within the scope of the invention.

What is claimed is:

1. A fiber optic transceiver (FOT) module comprising:
   a leadframe comprising at least a plurality of I/O pins and a printed circuit board attachment area having an area less than a total area of the leadframe, each I/O pin having a proximal end and a distal end;
   a plurality of electrically conductive attachment devices, wherein respective ones of the electrically conductive attachment devices are positioned on respective ones of the distal ends of respective ones of at least some of the I/O pins of the leadframe, wherein at least one of the electrically conductive attachment devices comprises electrically conductive adhesive and is positioned on the printed circuit board attachment area of the leadframe;
   a printed circuit board (PCB) having at least an upper surface and a lower surface, the lower surface of the PCB having a plurality of electrically conductive attachment pads positioned thereon, one or both of the upper and lower surfaces of the PCB having a plurality of electrically conductive bond pads positioned thereon, wherein the electrically conductive attachment pads on the lower surface of the PCB are in contact with respective ones of the electrically conductive attachment devices positioned on the leadframe, wherein the contact between said electrically conductive attachment pads and said respective ones of the electrically conductive attachment devices operates to secure the PCB to the leadframe and to provide electrical connections between the leadframe and the PCB;
   at least a first integrated circuit (IC), at least a first optical active device, and at least a first passive device mounted on one or both of the upper and lower surfaces of the PCB;
   a plurality of bond wires, each bond wire having at least a first end and a second end, wherein the first ends of at least some of the bond wires are attached to electrically conductive contact pads of said at least a first IC and wherein the second ends of said at least some of the bond wires are attached to at least some of the electrically conductive bond pads of the PCB; and
   an encapsulation that encapsulates at least a portion of the leadframe to which the PCB is attached such that the encapsulation encapsulates at least the PCB, said at least a first IC, said at first optical active device, and said at least a first passive device, and such that a major portion of the I/O pins including the proximal ends extends outside the encapsulation, and wherein the encapsulation has at least a first optical element formed therein at a location on the encapsulation for coupling light between said at least a first optical active device and a first end of a first optical waveguide.

2. The FOT module of claim 1, wherein the encapsulation is made of an optically transmissive polymer material.

3. The FOT module of claim 2, wherein said at least a first active device includes at least one laser diode.

4. The FOT module of claim 2, wherein said at least a first active device includes at least one light emitting diode (LED).

5. The FOT module of claim 2, wherein said at least a first active device includes at least one photodiode.

6. The FOT module of claim 1, wherein at least one of the bond wire is bonded at its first end to an electrically conductive contact pad of said at least a first IC and is bonded at its second end to one of the distal ends of one of the I/O pins of the leadframe.

7. The FOT module of claim 1, wherein at least one of the bond wires is bonded at its first end to an electrically conductive contact pad of said at least a first active device and is bonded at its second end to at least one of the electrically conductive bond pads of the PCB.

8. The FOT module of claim 1, wherein the first optical waveguide is an optical fiber and wherein the first end of the optical fiber is positioned in front of the encapsulation at the location where said at least a first optical element is formed in the encapsulation.

9. The FOT module of claim 1, further comprising:
   at least a second IC and at least a second active device mounted on one or both of the upper and lower surfaces of the PCB, wherein at least some of the bond wires are bonded at their first ends to electrically conductive contact pads of said at least a second IC and are bonded at their second ends to at least some of the electrically conductive bond pads of the PCB, and wherein the encapsulation also encapsulates at least said at least a second IC, said at least a second active device, and said at least a second passive device, and wherein the encapsulation has at least a second optical element formed therein at a location on the encapsulation for coupling light between said at least a second active device and a first end of a second optical fiber.

10. The FOT module of claim 9, wherein said at least a first optical active device comprises at least one laser diode and wherein said at least a second active device comprises at least one photodiode.

11. The FOT module of claim 9, wherein said at least a first active device comprises at least one light emitting diode (LED) and wherein said at least a second active device comprises at least one photodiode.

12. The FOT module of claim 9, wherein at least one of the bond wire is bonded at its first end to an electrically conductive contact pad of said at least a first IC and is bonded at its second end to one of the distal ends of one of the I/O pins of the leadframe, wherein at least one of the bond wire is bonded at its first end to an electrically conductive contact pad of said at least a second IC and is bonded at its second end to one of the distal ends of one of the I/O pins of the leadframe.

13. The FOT module of claim 9, wherein at least one of the bond wire is bonded at its first end to an electrically conductive contact pad of said at least a first active device and is bonded at its second end to at least one of the electrically conductive bond pads of the PCB, and wherein at least one of the bond wire is bonded at its first end to an electrically conductive contact pad of said at least a second active device and is bonded to its second end to at least one of the electrically conductive bond pads of the PCB.

14. The FOT module of claim 1, wherein the first optical waveguide is a first optical fiber and wherein the first end of the first optical fiber is positioned in front of the encapsulation at the location where said at least a first optical element is formed in the encapsulation, and wherein the second optical waveguide is a second optical fiber and wherein the first end of the second optical fiber is positioned in front of the encapsulation at the location where said at least a second optical element is formed in the encapsulation.

15. A method for making a fiber optical transceiver (FOT) module comprising:
   providing a printed circuit board (PCB) having electrically conductive bonds pads on at least one surface thereof;
   placing an electrically conductive adhesive material on an FOT leadframe at particular locations on the leadframe, the leadframe having a plurality of I/O pins extending therefrom, each I/O pin having a proximal end and a distal end, the electrically conductive adhesive material placed on the distal ends of at least some of the I/O pins of the leadframe;

placing the PCB in contact with the leadframe such that one or more of the electrically conductive bond pads of the PCB comes into contact with the electrically conductive adhesive material on the leadframe;

attaching at least a first integrated circuit (IC), at least a first optical active device, and at least a first passive device to at least one surface of the PCB;

electrically interconnecting one or more electrically conductive contact pads of said at least a first IC with one or more of the electrically conductive bond pads of the PCB; and encapsulating at least a portion of the leadframe to which the PCB is attached within an encapsulation such that the encapsulation encapsulates at least the PCB, said at least a first IC, said at least a first active device, and said at least a first passive device, and such that a major portion of the I/O pins including the proximal ends extends outside the encapsulation, wherein the encapsulation has at least a first optical element formed therein at a location on the encapsulation for coupling light between said at least a first active device and a first end of a first optical waveguide.

16. The method of claim 15, further comprising:
electrically interconnecting one or more of the electrically conductive contact pads of said at least a first active device with one or more of the electrically conductive bond pads of the PCB.

17. The method of claim 16, further comprising:
electrically interconnecting one or more of the electrically conductive bond pads of the PCB with the distal ends of one or more of the I/O pins of the leadframe.

18. The method of claim 15, wherein the encapsulation is made of an optically transmissive polymer material.

19. The method of claim 15, wherein said at least a first active device includes at least one laser diode.

20. The method of claim 15, wherein said at least a first active device includes at least one light emitting diode (LED).

21. The method of claim 15, wherein said at least a first active device includes at least one photodiode.

22. The method of claim 15, further comprising:
attaching at least a second IC, at least a second active device, and at least a second passive device to at least one surface of the PCB; and electrically interconnecting one or more electrically conductive contact pads of said at least a second IC with one or more of the electrically conductive bond pads of the PCB, wherein the encapsulation also encapsulates at least said at least a second IC, said at least a second active device, and said at least a second passive device, and wherein the encapsulation has at least a second optical element formed therein at a location on the encapsulation for coupling light between said at least a second active device and a first end of a second optical waveguide.

23. The method of claim 22, wherein said at least a second active device includes one of a laser diode, a light emitting diode (LED), and a photodiode.

* * * * *